US012646904B2

(12) United States Patent
Hatori

(10) Patent No.: US 12,646,904 B2
(45) Date of Patent: Jun. 2, 2026

(54) OPTICAL SEMICONDUCTOR DEVICE

(71) Applicant: Fujitsu Optical Components Limited, Kawasaki (JP)

(72) Inventor: Nobuaki Hatori, Tsukuba (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 482 days.

(21) Appl. No.: 18/138,385

(22) Filed: Apr. 24, 2023

(65) Prior Publication Data

US 2023/0378716 A1      Nov. 23, 2023

(30) Foreign Application Priority Data

May 17, 2022      (JP) ................................. 2022-080926

(51) Int. Cl.
| | |
|---|---|
| *H01S 5/02* | (2006.01) |
| *G02B 6/42* | (2006.01) |
| *H01S 5/0234* | (2021.01) |
| *H01S 5/30* | (2006.01) |

(52) U.S. Cl.
CPC .......... *H01S 5/0234* (2021.01); *G02B 6/4257* (2013.01); *H01S 5/3013* (2013.01)

(58) Field of Classification Search
CPC .... H01S 5/0234; H01S 5/3013; G02B 6/4257
See application file for complete search history.

(56) References Cited

U.S. PATENT DOCUMENTS 7,113,658 B2 * 9/2006 Ide ...................... H01S 5/02257
                                                            385/11

8,036,507 B2 * 10/2011 Watanabe .............. G02B 6/423
                                                            385/52
8,774,576 B2 * 7/2014 Shiraishi .............. H05K 1/0274
                                                            385/33
9,128,240 B2 * 9/2015 Hatori ................. G02B 6/1228
9,638,859 B1 * 5/2017 Nuttall ................. G02B 6/4274
10,025,045 B2 * 7/2018 Nuttall ................... G02B 6/423

(Continued)

FOREIGN PATENT DOCUMENTS

| JP | 2010-20180 A | 1/2010 |
|---|---|---|
| JP | 2012-182367 A | 9/2012 |

(Continued)

OTHER PUBLICATIONS

Lu et al., Singular stress fields at corners in flip-chip packages, Engineering Fracture Mechanics, vol. 86, 2012, pp. 38-47, ISSN 0013-7944, https://doi.org/10.1016/j.engfracmech.2012.02.010. (Year: 2012).*

(Continued)

*Primary Examiner* — Peter Radkowski
(74) *Attorney, Agent, or Firm* — STAAS & HALSEY LLP

(57) ABSTRACT

An optical semiconductor device includes a first optical device formed on a silicon substrate having a first surface, and a second optical device including a compound semiconductor, mounted on the first optical device, and having a second surface facing the first surface. The first optical device includes a first protrusion that protrudes toward the second surface, and a portion of the second surface makes contact with the first protrusion. In a plan view, the first protrusion is located on an inner side of an outer edge of the second optical device.

14 Claims, 20 Drawing Sheets

(56) References Cited

U.S. PATENT DOCUMENTS

| | | | | | |
|---|---|---|---|---|---|
| 10,495,830 | B2 * | 12/2019 | Nuttall | ................... | G02B 6/428 |
| 10,816,740 | B2 * | 10/2020 | Novack | .................. | G02B 6/423 |
| 11,177,623 | B2 * | 11/2021 | Hatori | .................. | G02B 6/4228 |
| 11,217,460 | B2 * | 1/2022 | Kulkarni | ............. | H01L 23/3135 |
| 2005/0084218 | A1 * | 4/2005 | Ide | ...................... | H01S 5/18311 |
| | | | | | 385/11 |
| 2010/0008622 | A1 * | 1/2010 | Watanabe | .......... | G02B 6/12004 |
| | | | | | 385/14 |
| 2012/0076454 | A1 * | 3/2012 | Shiraishi | .............. | G02B 6/4224 |
| | | | | | 29/846 |
| 2014/0294341 | A1 * | 10/2014 | Hatori | .................. | G02B 6/1228 |
| | | | | | 385/14 |
| 2014/0319656 | A1 | 10/2014 | Marchena et al. | | |
| 2015/0036964 | A1 * | 2/2015 | Okano | .................. | G02B 6/125 |
| | | | | | 385/14 |
| 2017/0098922 | A1 * | 4/2017 | Hatori | .................. | H04B 10/501 |
| 2017/0205594 | A1 * | 7/2017 | Nuttall | ..................... | G02B 6/30 |
| 2018/0314017 | A1 * | 11/2018 | Nuttall | ................ | G02B 6/4274 |
| 2019/0131761 | A1 * | 5/2019 | Hatori | .................... | H01S 5/341 |
| 2019/0348303 | A1 * | 11/2019 | Kulkarni | ................. | H01L 24/27 |
| 2020/0057216 | A1 * | 2/2020 | Nuttall | ................. | G02B 6/4274 |
| 2020/0132951 | A1 * | 4/2020 | Hatori | ................... | H01S 5/1085 |
| 2020/0249405 | A1 * | 8/2020 | Novack | .................. | G02B 6/423 |
| 2020/0278506 | A1 * | 9/2020 | Aalto | .................... | G02B 6/423 |
| 2022/0123518 | A1 | 4/2022 | He et al. | | |

FOREIGN PATENT DOCUMENTS

| | | |
|---|---|---|
| JP | 2018-133425 | 8/2018 |
| JP | 2022-68131 | 5/2022 |

OTHER PUBLICATIONS

Budd et al., "Semiconductor Optical Amplifier (SOA) Packaging for Scalable and Gain-Integrated Silicon Photonic Switching Platforms", Electronic Components & Technology Conference, 2015, pp. 1280-1286.

Japanese Office Action mailed on Nov. 4, 2025 for corresponding Japanese Patent Application No. 2022-080926.

* cited by examiner

FIG.12

OPTICAL SEMICONDUCTOR DEVICE

CROSS-REFERENCE TO RELATED APPLICATIONS

This application is based upon and claims the benefit of priority of the prior Japanese Patent Application No. 2022-080926, filed on May 17, 2022, the entire contents of which are incorporated herein by reference.

FIELD

The embodiments discussed herein are related to optical semiconductor devices.

BACKGROUND

Silicon photonics in which an optical functional device is formed on a silicon substrate are being developed, because of the superiority of processing techniques, pervasive industrial effects, optical shrink of devices, or the like provided thereby. Optical integrated devices having an optical modulator or a photo receiver (or optical receiver) formed on the silicon substrate, for example, are being studied.

However, because silicon does not have a light emitting mechanism, signal light is input from the outside. In addition, silicon does not have a light amplifying function. For this reason, an optical amplification mechanism may be provided separately from the silicon substrate, in order to amplify a weak optical signal. There is a known optical semiconductor device having an optical device, such as a semiconductor laser (laser diode: LD), a semiconductor optical amplifier (SOA), or the like flip-chip bonded to the silicon substrate, for example. In order to obtain a high coupling efficiency between the optical device and the silicon substrate in the optical semiconductor device having such a known configuration, a high-precision alignment on a submicron scale, for example, is desired. In the related art, there is a proposed technique that forms on the silicon substrate a structure having a height thereof adjusted in advance, and performs an alignment in the height direction using the height-adjusted structure.

Examples of related art include U.S. Pat. No. 10,816,740, Japanese Laid-Open Patent Publication No. 2012-182367, Japanese Laid-Open Patent Publication No. 2010-020180, and Russell A. Budd et al., Semiconductor Optical Amplifier (SOA) Packaging for Scalable and Gain-Integrated Silicon Photonic Switching Platforms, Electronic Components & Technology Conference 2015, pp. 1280-1286, for example.

Optical devices such as the LD, the SOA, or the like are formed using a material that is more fragile than silicon, such as InP or the like. For this reason, in the related art, when the optical device makes contact with a structure formed on the silicon substrate, a corner portion of the optical device may be damaged and chipped, for example. When the corner portion of the optical device is chipped, a crack may extend from the chipped portion to an inside of the optical device, such as to a waveguide or the like of the optical device. Otherwise, a chipped portion of the optical device may interfere with the alignment. The extension of the crack and the deterioration in the alignment accuracy may deteriorate a yield and a reliability of the optical device.

SUMMARY

It is an object in one aspect of the present disclosure to provide an optical semiconductor device capable of reducing chipping of an optical device.

According to one aspect of the present disclosure, an optical semiconductor device includes a first optical device formed on a silicon substrate having a first surface; and a second optical device including a compound semiconductor, mounted on the first optical device, and having a second surface facing the first surface, wherein the first optical device includes a first protrusion that protrudes toward the second surface, a portion of the second surface makes contact with the first protrusion, and in a plan view, the first protrusion is located on an inner side of an outer edge of the second optical device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a sectional view (part 7) illustrating the method for manufacturing the optical device according to the first embodiment;

DESCRIPTION OF EMBODIMENTS

Figure 1:
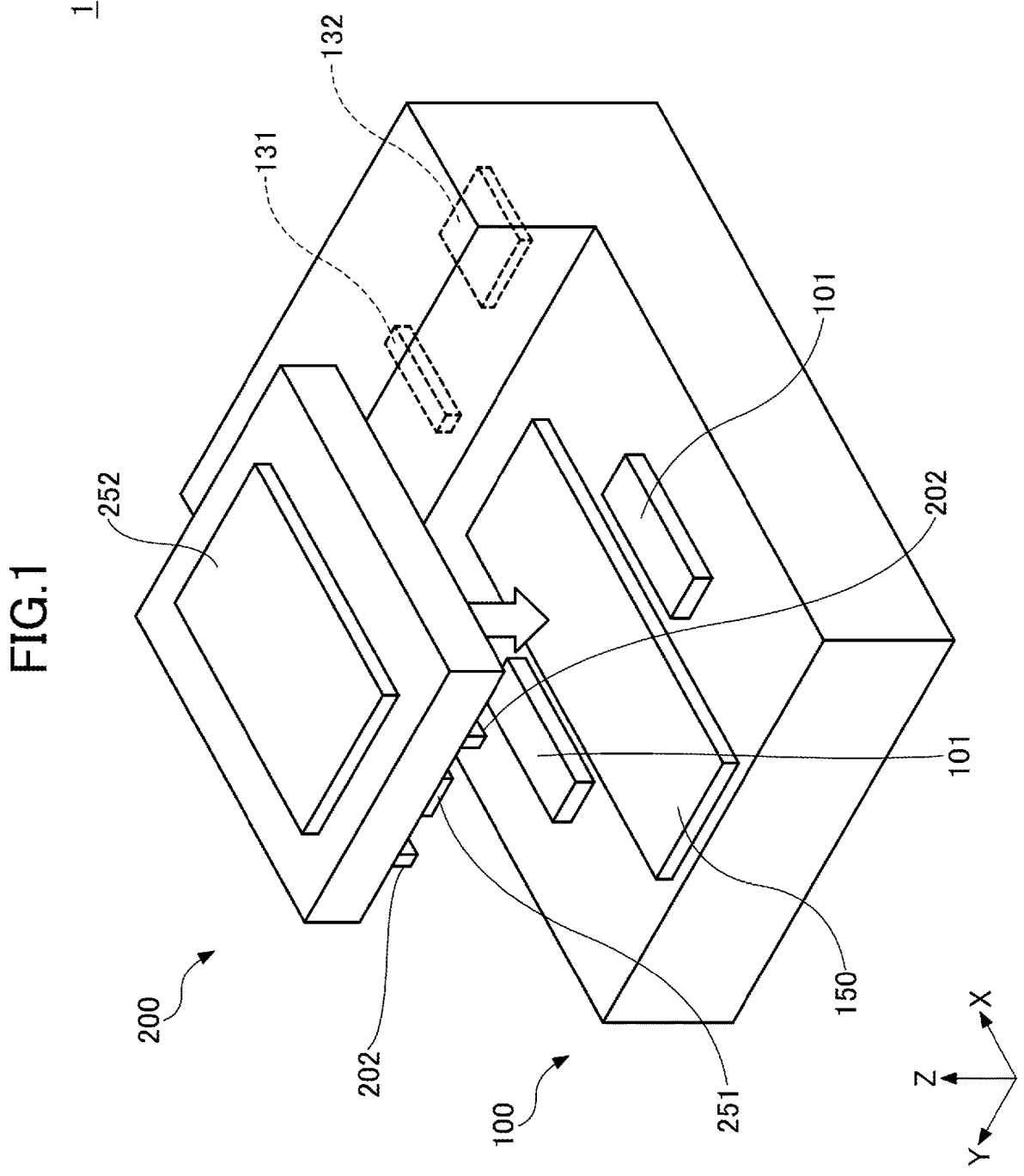
FIG. 1 is a disassembled perspective view illustrating an optical semiconductor device according to a first embodiment.

Hereinafter, embodiments of the present disclosure will be specifically described with reference to the accompanying drawings. In the present specification and the drawings, constituent elements having substantially the same functional configuration are designated by the same reference numerals, and a description thereof may be omitted. In addition, although an XYZ orthogonal coordinate system is used in the following description, the coordinate system is merely defined for the sake of convenience for the description, and an orientation of the optical semiconductor device or the like is not particularly limited. Moreover, a view perpendicular to an XY-plane is referred to as a plan view. Further, and when viewed from an arbitrary point, a +Z-direction may be referred to as an upward direction, an upper side, or upward, and a −Z-direction may be referred to as downward direction, a lower side, or downward.

First Embodiment

Figure 2:
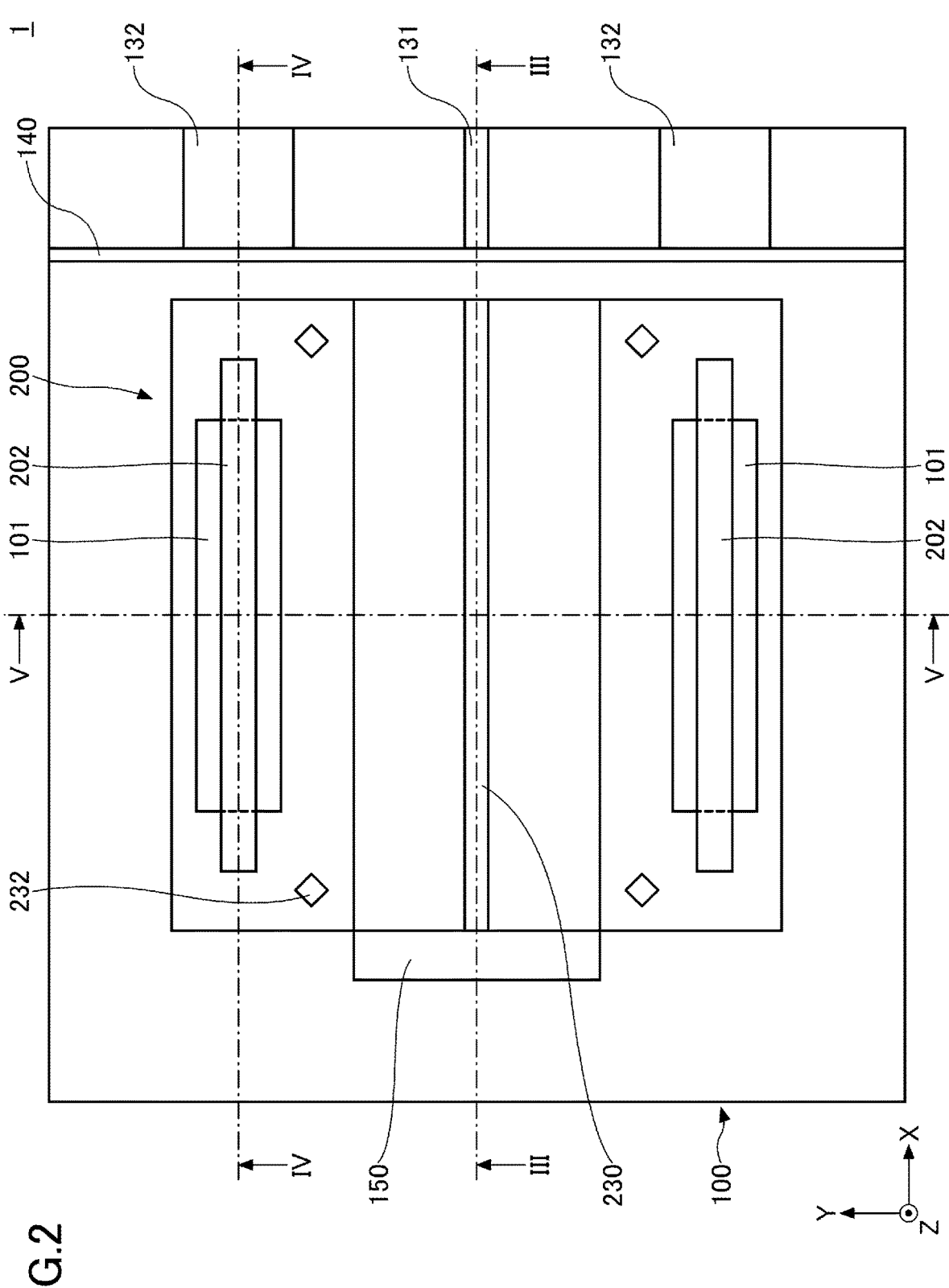
FIG. 2 is a schematic view illustrating an arrangement of respective parts of the optical semiconductor device according to the first embodiment.
Figure 3:
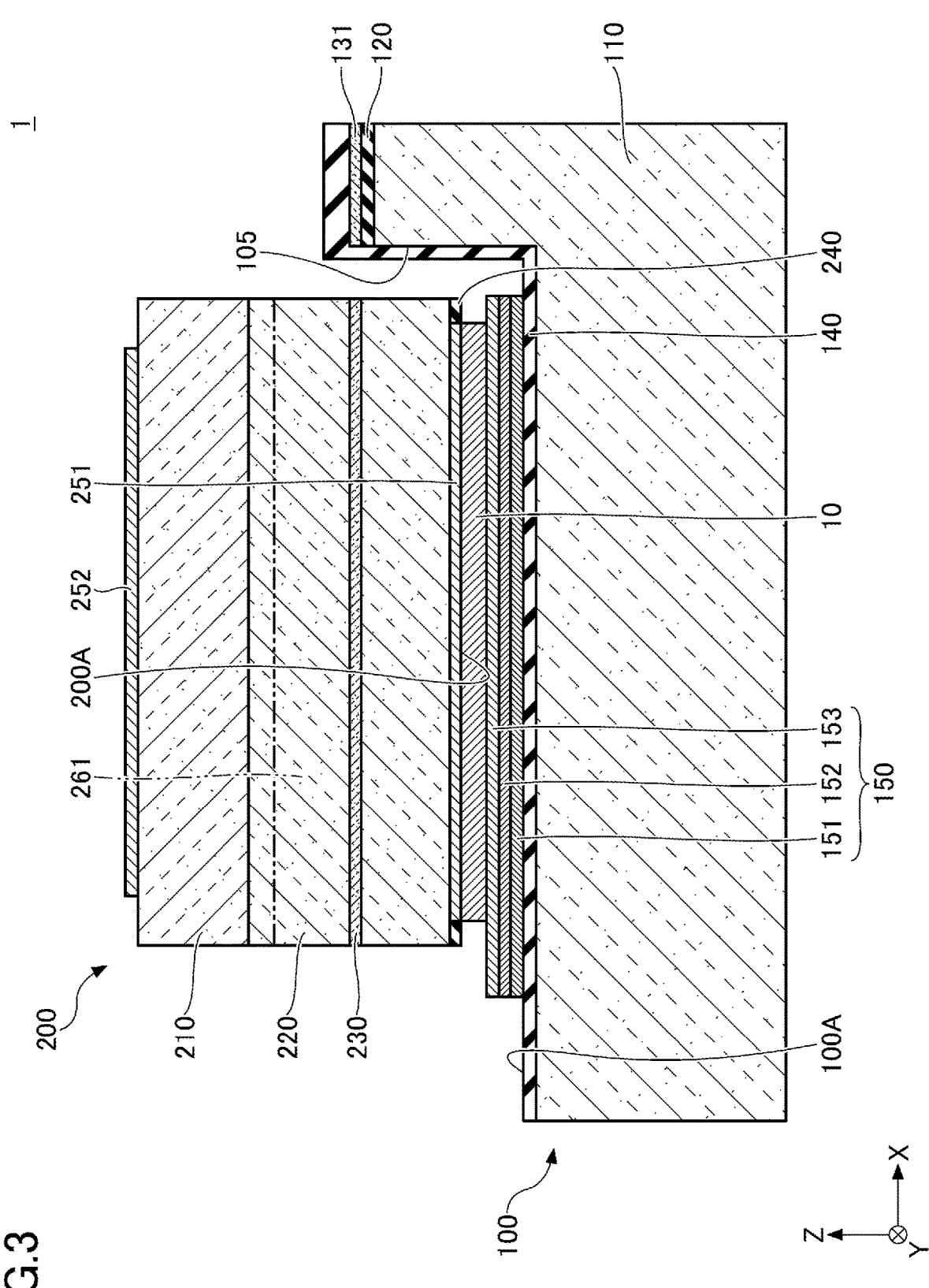
FIG. 3 is a cross sectional view (part 1) illustrating the optical semiconductor device according to the first embodiment.
Figure 4:
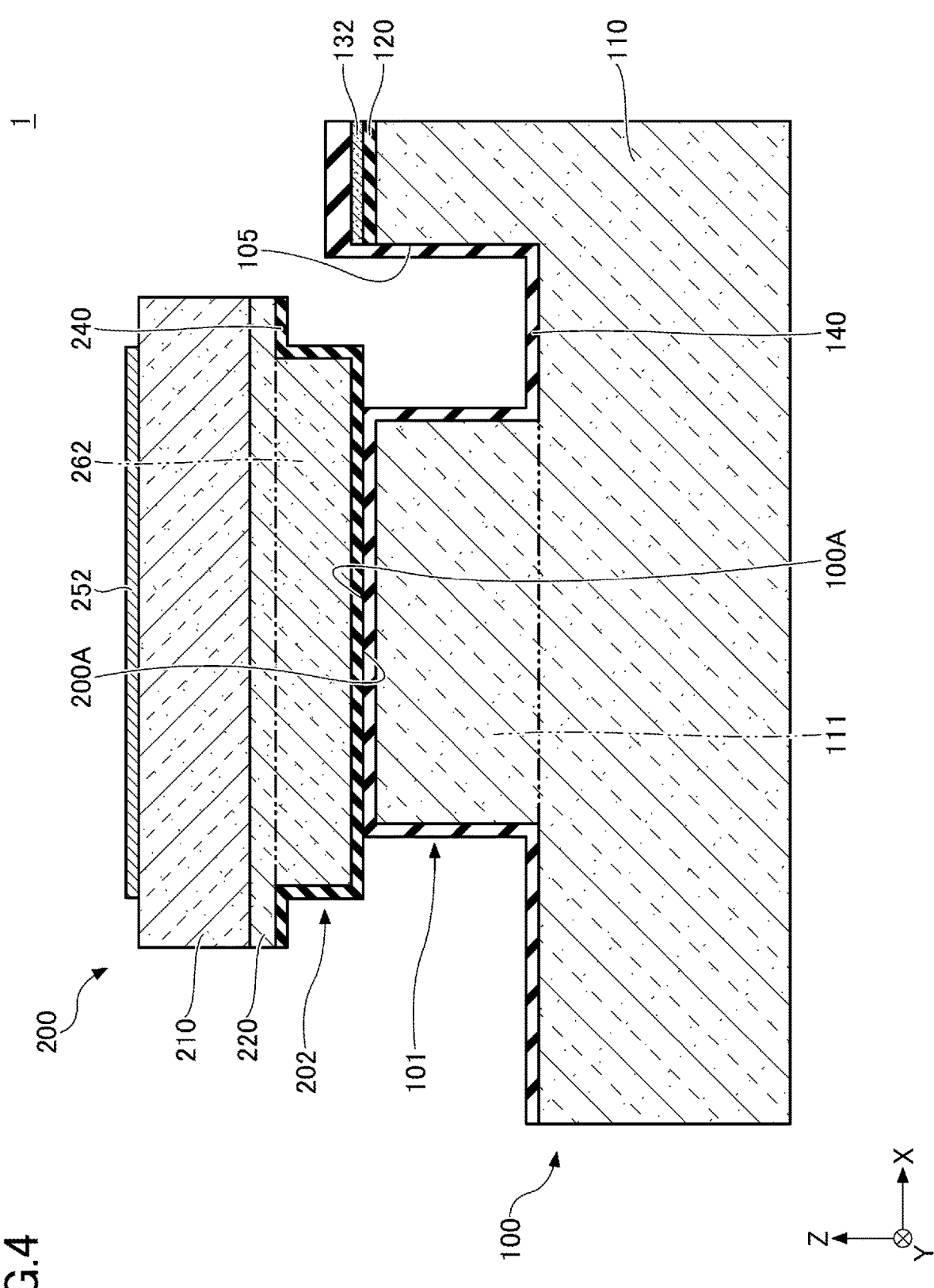
FIG. 4 is a cross sectional view (part 2) illustrating the optical semiconductor device according to the first embodiment.
Figure 5:
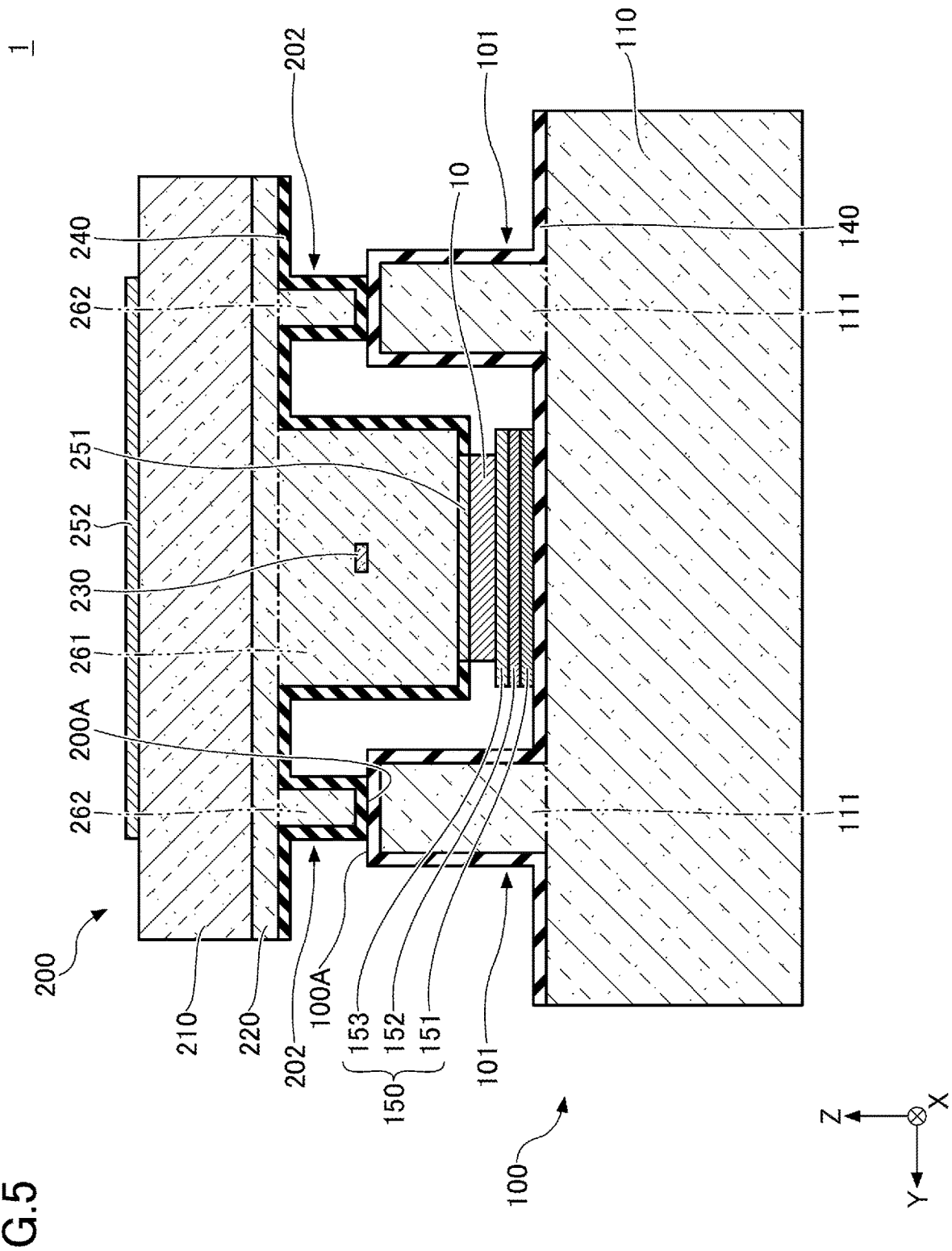
FIG. 5 is a cross sectional view (part 3) illustrating the optical semiconductor device according to the first embodiment.

A first embodiment will be described. The first embodiment relates to an optical semiconductor device. FIG. 1 is a disassembled perspective view illustrating the optical semiconductor device according to the first embodiment. FIG. 2 is a schematic view illustrating an arrangement of respective parts of the optical semiconductor device according to the first embodiment. FIG. 3 through FIG. 5 are cross sectional views illustrating the optical semiconductor device according to the first embodiment. FIG. 3 corresponds to a cross sectional view along a line III-III in FIG. 2. FIG. 4 corresponds to a cross sectional view along a line IV-IV in FIG. 2. FIG. 5 corresponds to a cross sectional view along a line V-V in FIG. 2.

As illustrated in FIG. 1 through FIG. 5, an optical semiconductor device 1 according to the first embodiment includes a silicon photonics device 100 having a first surface 100A, and an optical device 200 having a second surface 200A. The optical device 200 includes a compound semiconductor, and is mounted on the silicon photonics device 100. The second surface 200A faces the first surface 100A. In the first embodiment, the optical device 200 is a semiconductor laser (laser diode: LD).

The silicon photonics device 100 includes a silicon on insulator (SOI) substrate, for example. That is, the silicon photonics device 100 includes a silicon substrate 110, an insulating layer 120, and a silicon layer. The silicon layer includes a waveguide 131, and alignment marks 132. The waveguide 131 extends along the X-axis direction. The alignment mark 132 is provided at two positions on the +Y-side and the −Y-side of the waveguide 131, for example. The silicon layer may further include an optical functional device, such as an optical modulator, a photo receiver (or optical receiver), a grating coupler, or the like. A modulation signal input-output electrode, a phase adjustment electrode, or the like may be connected to the optical modulator and the photo receiver. The silicon photonics device 100 formed on the silicon substrate 110 is an example of a first optical device.

A groove 105, reaching a middle of the silicon substrate 110 in a thickness direction, is formed in the SOI substrate. The silicon photonics device 100 includes an insulating layer 140 covering the SOI substrate. The insulating layer 140 also covers a sidewall surface and a bottom surface of the groove 105. An electrode 150 is formed on the insulating layer 140 at the bottom surface of the groove 105. In the plan view, the electrode 150 has a rectangular planar shape in which the X-axis direction is a longitudinal direction, and the Y-axis direction is a lateral (or short) direction. The electrode 150 includes a Ti layer 151 on the insulating layer 140, a Pt layer 152 on the Ti layer 151, and a Au layer 153 on the Pt layer 152, for example.

The silicon substrate 110 is formed with a protruding portion 111 that protrudes from the bottom surface of the groove 105 toward the second surface 200A. The silicon photonics device 100 includes first protrusions 101 that protrude toward the second surface 200A, inside the groove 105. Each first protrusion 101 includes the protruding portion 111 of the silicon substrate 110, and a portion of the insulating layer 140 covering the protruding portion 111. The first protrusion 101 is provided at two positions on the +Y-side and the −Y-side of the electrode 150, for example. In the plan view, the first protrusion 101 has a rectangular planar shape in which the X-axis direction is a longitudinal direction, and the Y-axis direction is a lateral (or short) direction. For example, a length of the first protrusion 101 along the X-axis direction is approximately 330 μm, and a length of the first protrusion 101 along the Y-axis direction is approximately 50 μm. In addition, a distance between a center of the electrode 150 along the Y-axis direction, and a center of the first protrusion 101 along the Y-axis direction, is approximately 167.5 μm.

The optical device 200 includes a InP substrate 210, a cladding layer 220, an active layer 230, alignment marks 232, an insulating layer 240, an electrode 251, and an electrode 252. The cladding layer 220 is provided below the InP substrate 210, and the active layer 230 is formed in the cladding layer 220. The insulating layer 240 covers the cladding layer 220. The cladding layer 220 and the active layer 230 include a InP-based material. In the plan view, the optical device 200 has a rectangular planar shape in which the X-axis direction is a longitudinal direction, and the Y-axis direction is a lateral (or short) direction. The cladding layer 220 has a mesa structure 261 extending in the X-axis direction, and the active layer 230 is formed in the mesa structure 261. For example, a length of the optical device 200 along the X-axis direction is approximately 800 μm, and a length of the optical device 200 along the Y-axis direction is approximately 500 μm. The active layer 230 extends along the X-axis direction. The mesa structure 261 and the active layer 230 are provided at a center of the optical device 200 along the Y-axis direction. The active layer 230 is separated from the waveguide 131 along the X-axis direction. In addition, the active layer 230 is located at the same position as the waveguide 131 along two directions, namely, the Y-axis direction and the Z-axis direction. The X-axis direction is an example of a first direction. The optical device 200 is an example of a second optical device.

A protruding portion 262, protruding from a surface around the mesa structure 261 toward the first surface 100A, is formed in the cladding layer 220. The optical device 200 include second protrusions 202 protruding toward the first surface 100A. Each second protrusion 202 includes the protruding portion 262 of the cladding layer 220, and a portion of the insulating layer 240 covering the protruding portion 262. The second protrusion 202 is provided at two positions on the +Y-side and the −Y-side of the mesa structure 261, for example. In the plan view, the second protrusion 202 has a rectangular planar shape in which the X-axis direction is a longitudinal direction, and the Y-axis direction is a lateral (or short) direction. For example, a length of the second protrusion 202 along the X-axis direction is approximately 490 μm, and a length of the second protrusion 202 along the Y-axis direction is approximately 10 μm. One of the alignment marks 232 is provided near an end portion on the +X-side of one of the second protrusions 202, and the other of the alignment marks 232 is provided near an end portion on the −X-side of the other of the second protrusions 202, respectively.

An opening that exposes a lower surface of the cladding layer 220 is formed in the insulating layer 240, and the electrode 251 that makes contact with the lower surface of the cladding layer 220 is provided inside the opening. The electrode 251 makes ohmic contact with the cladding layer 220. In addition, the electrode 252 makes contact with an upper surface of the InP substrate 210. The electrode 252 makes ohmic contact with the InP substrate 210.

A portion of the second surface 200A of the optical device 200 makes contact with the first protrusion 101. More particularly, a surface of the second protrusion 202, facing the first protrusion 101, makes contact with the first protrusion 101. A width (a length along the Y-axis direction) of the second protrusion 202 is smaller than a width (a length along the Y-axis direction) of the first protrusion 101. As illustrated in FIG. 5, the entire surface of the second protrusion 202 facing the first protrusion 101 makes contact with the first protrusion 101, along the Y-axis direction. On the other hand, a length (a length along the X-axis direction) of the second protrusion 202 is greater than a length (a length along the X-axis direction) of the first protrusion 101. As illustrated in FIG. 4, a portion of the surface of the second protrusion 202 facing the first protrusion 101 makes contact with the first protrusion 101, and other portions of the surface of the second protrusion 202 facing the first protrusion 101 do not make contact the first protrusion 101 and protrudes from the first protrusion 101, along the X-axis direction. The second protrusion 202 protrudes from the first protrusion 101 by a length of 80 μm, for example, toward both the +X-side and the −X-side.

A conductive bonding material 10 is provided between the electrode 150 of the silicon photonics device 100 and the electrode 251 of the optical device 200. The electrode 150 and the electrode 251 are electrically connected via the conductive bonding material 10. The conductive bonding material 10 is a AuSn solder, for example.

In addition, in the plan view, each of the first protrusions 101 is located on the inner side of an outer edge of the optical device 200. That is, an end portion on the +X-side of the first protrusion 101 is located on the −X-side with respect to a side surface on the +X-side of the optical device 200, and an end portion on the −X-side of the first protrusion 101 is located on the +X-side with respect to a side surface on the −X-side of the optical device 200. Moreover, an end portion on the +Y-side of the first protrusion 101 is located on the −Y-side with respect to a side surface on the +Y-side of the optical device 200, and an end portion on the −Y-side of the first protrusion 101 is located on the +Y-side with respect to a side surface on the −Y-side of the optical device 200.

Next, a method for manufacturing the optical device 200 will be described. FIG. 6 through FIG. 12 are cross sectional views illustrating the method for manufacturing the optical device according to the first embodiment. The method will be described for the configuration described in a state where the configuration is turned upside down.

Figure 6:
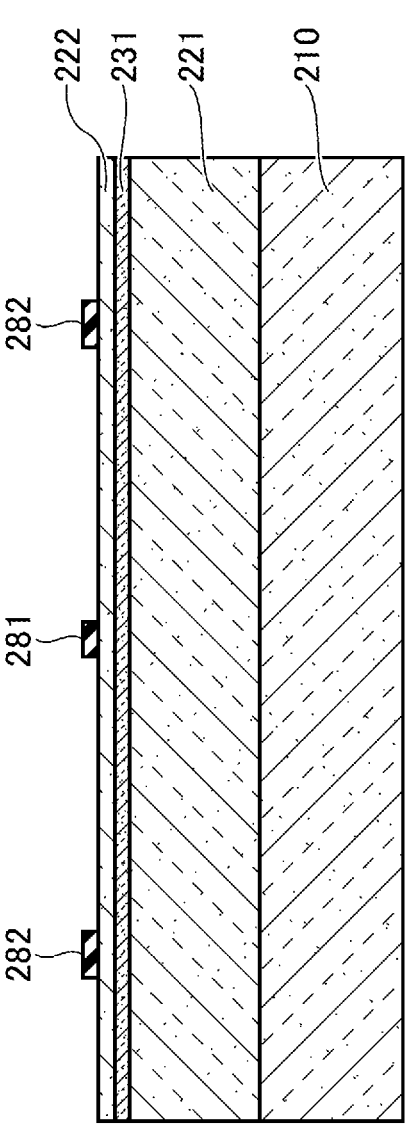
FIG. 6 is a cross sectional view (part 1) illustrating a method for manufacturing the optical device according to the first embodiment.

First, as illustrated in FIG. 6, InP-based semiconductor layers 221, 231, and 222 are formed on the InP substrate 210. The semiconductor layers 221 and 222 become a portion of the cladding layer 220, and the semiconductor layer 231 becomes the active layer 230. Next, insulating masks 281 and 282 are formed on the semiconductor layer 222. The mask 281 is formed in a region (or area) where the active layer 230 is to be formed, and the mask 282 is formed in a region where the protruding portion 262 is to be formed.

Figure 7:
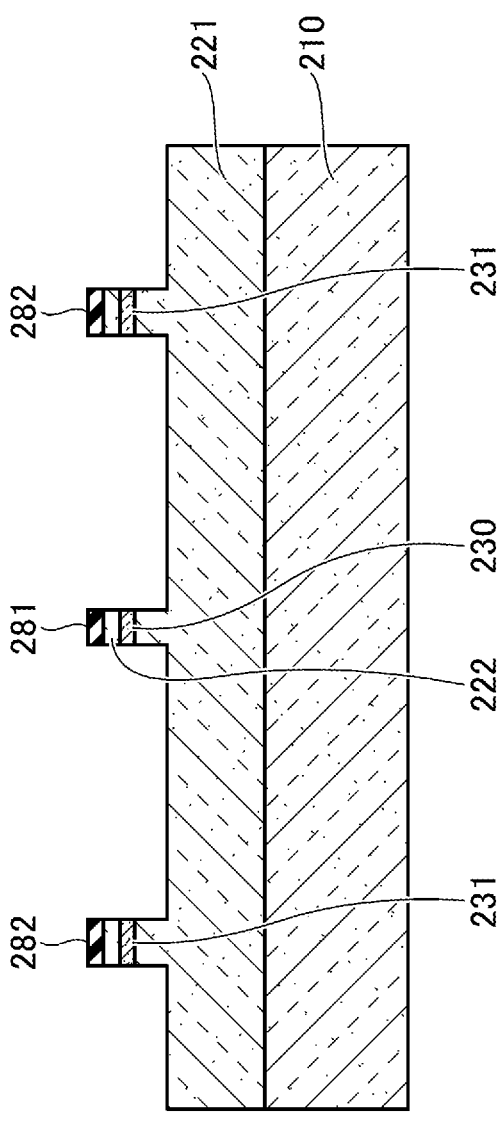
FIG. 7 is a cross sectional view (part 2) illustrating the method for manufacturing the optical device according to the first embodiment.

Thereafter, as illustrated in FIG. 7, the semiconductor layers 221, 231, and 222 are etched using the masks 281 and 282. This etching is stopped halfway along the thickness direction of the semiconductor layer 221. As a result, the active layer 230 is formed from the semiconductor layer 231.

Figure 8:
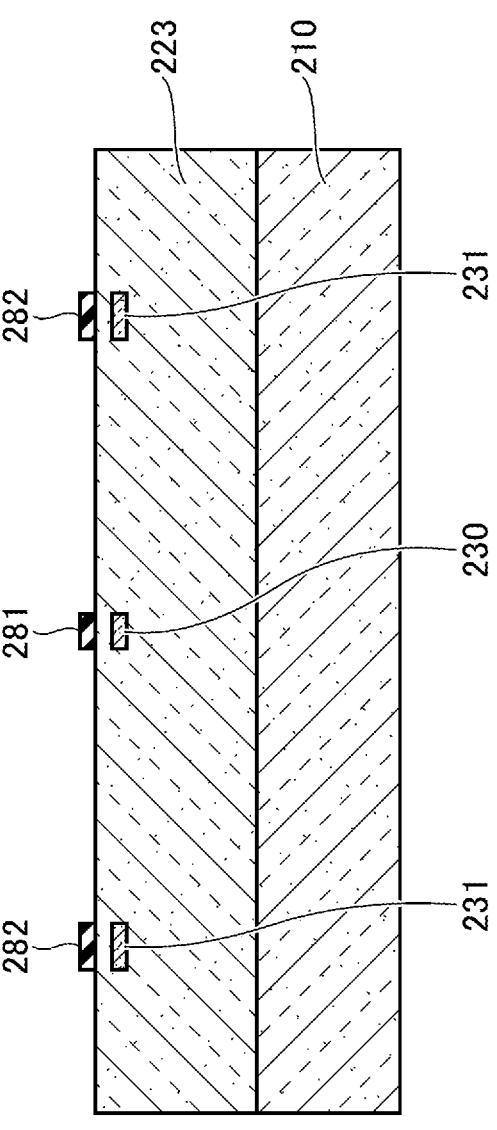
FIG. 8 is a cross sectional view (part 3) illustrating the method for manufacturing the optical device according to the first embodiment.

Next, as illustrated in FIG. 8, a semiconductor layer is regrown in a state where the masks 281 and 282 remain, so as to form a semiconductor layer 223 including the semiconductor layers 221 and 222. For example, a position of an upper surface of the semiconductor layer 223 is the same as a position of an upper surface of the semiconductor layer 222, or is near the position of the upper surface of the semiconductor layer 222.

Figure 9:
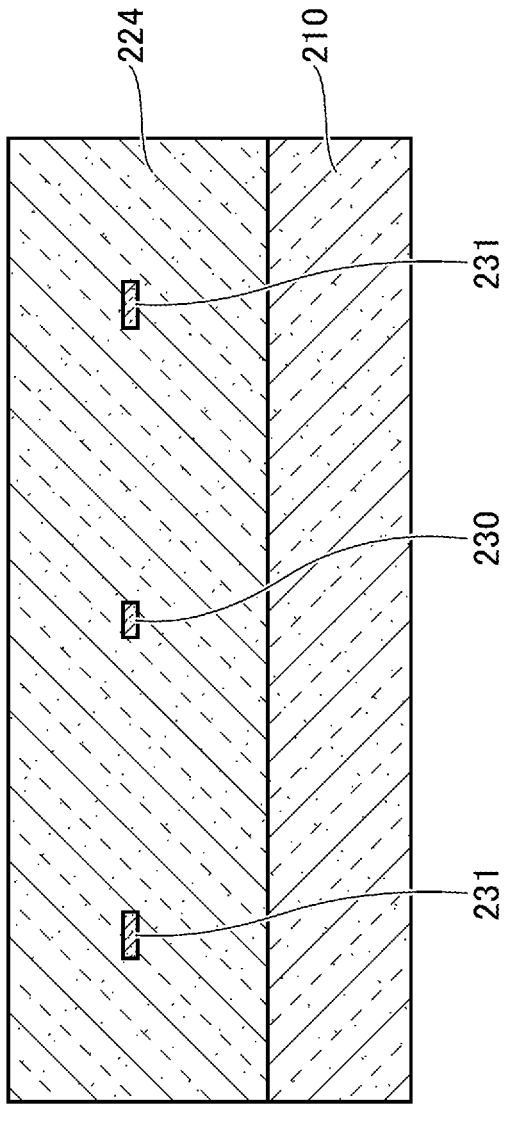
FIG. 9 is a cross sectional view (part 4) illustrating the method for manufacturing the optical device in the first embodiment.

Next, as illustrated in FIG. 9, the masks 281 and 282 are removed, and a semiconductor layer is regrown, so as to form a semiconductor layer 224 including the semiconductor layer 223. A thickness of the semiconductor layer 224 is made the same as a thickness of the cladding layer 220.

Figure 10:
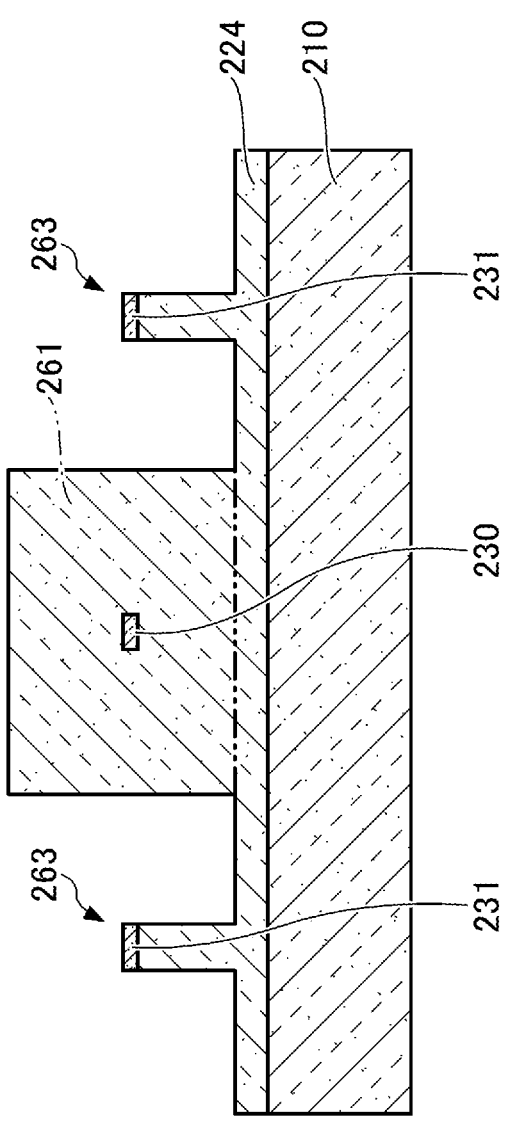
FIG. 10 is a cross sectional view (part 5) illustrating the method for manufacturing the optical device in the first embodiment.

Thereafter, the semiconductor layer 224 is etched using a mask (not illustrated), so as to form the mesa structure 261, and form the protruding portion 262 including the semiconductor layers 224 and 231 in a region where a protruding portion 263 is to be formed, as illustrated in FIG. 10. This etching may be performed in multiple etching steps.

Figure 11:
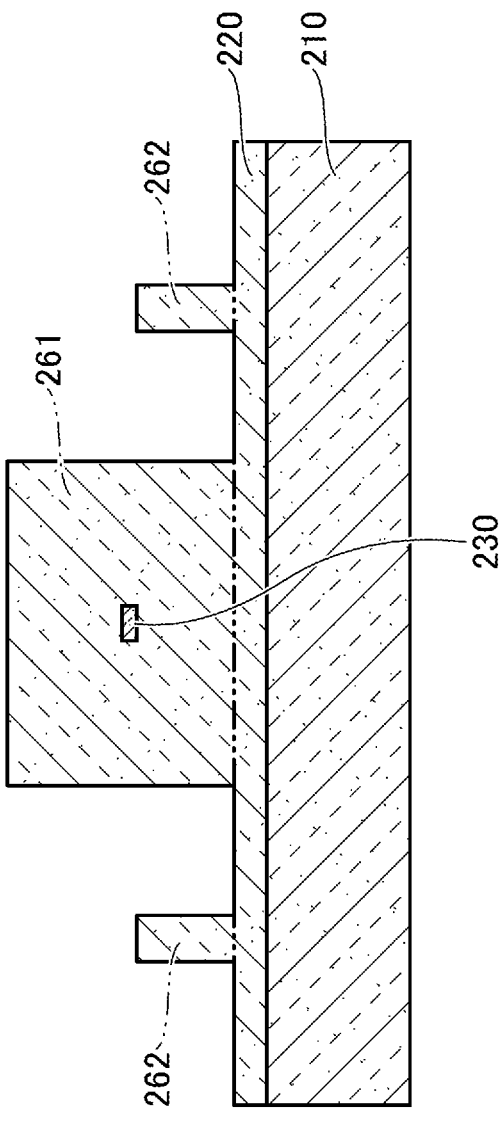
FIG. 11 is a cross sectional view (part 6) illustrating the method for manufacturing the optical device according to the first embodiment.

Next, the mask is removed, and the protruding portion 263 is etched using another mask (not illustrated), so as to form the protruding portion 262 as illustrated in FIG. 11. During this etching, the semiconductor layer 231 is removed, for example.

Figure 12:
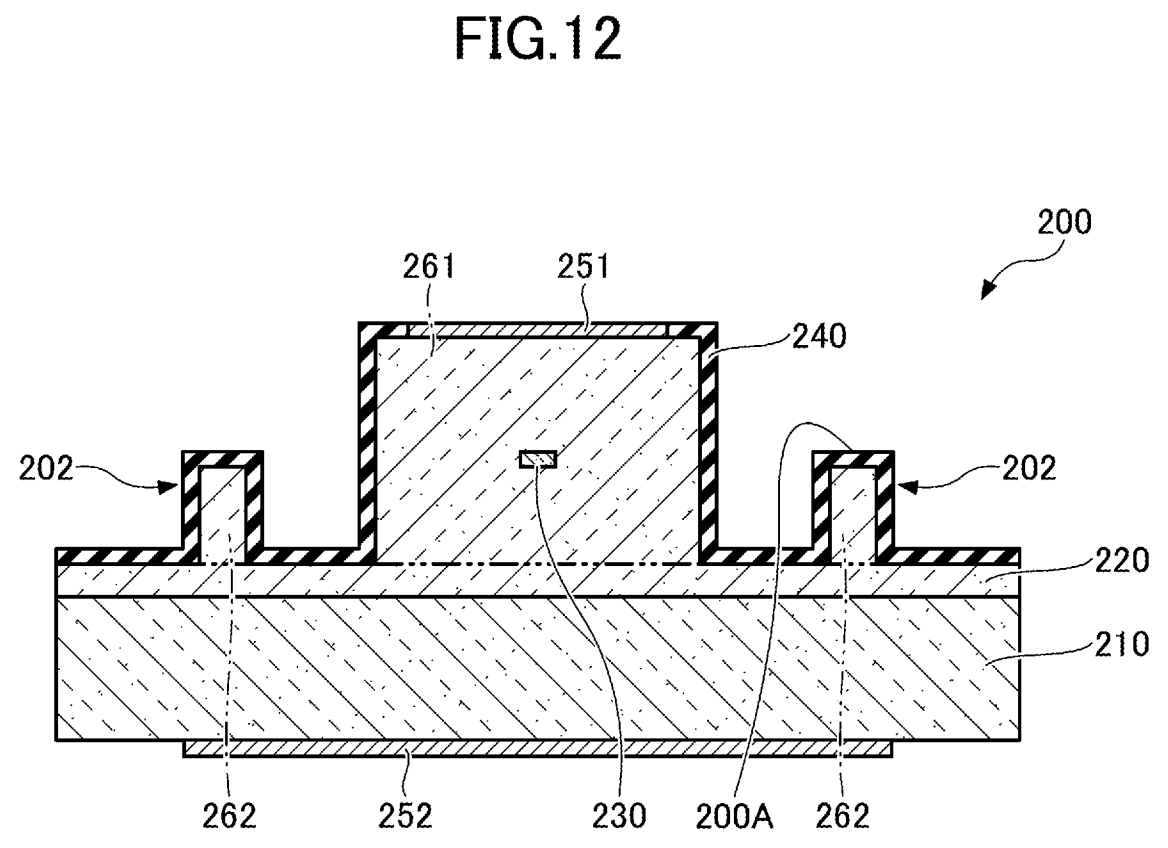

Next, the other mask is removed, and the insulating layer 240, the electrode 251, and the electrode 252 are formed as illustrated in FIG. 12.

The optical device 200 can be manufactured by the processes or steps described above.

When flip-chip bonding the optical device 200 onto the silicon photonics device 100, it is possible to perform a high-precision alignment between the silicon photonics device 100 and the optical device 200 in a height direction (or Z-axis direction), by causing the second protrusion 202 to make contact with the first protrusion 101. In addition, it is possible to perform a high-precision alignment between the silicon photonics device 100 and the optical device 200 on the XY-plane, by an image recognition using the alignment marks 132 and 232. Accordingly, it is possible to perform a high-prevision alignment of the waveguide 131 and the active layer 230 on a submicron scale, for example. When performing the flip-chip bonding, a force in a direction toward the silicon photonics device 100 is applied to the optical device 200 until the optical device 200 is fixed to the silicon photonics device 100.

Figure 13:
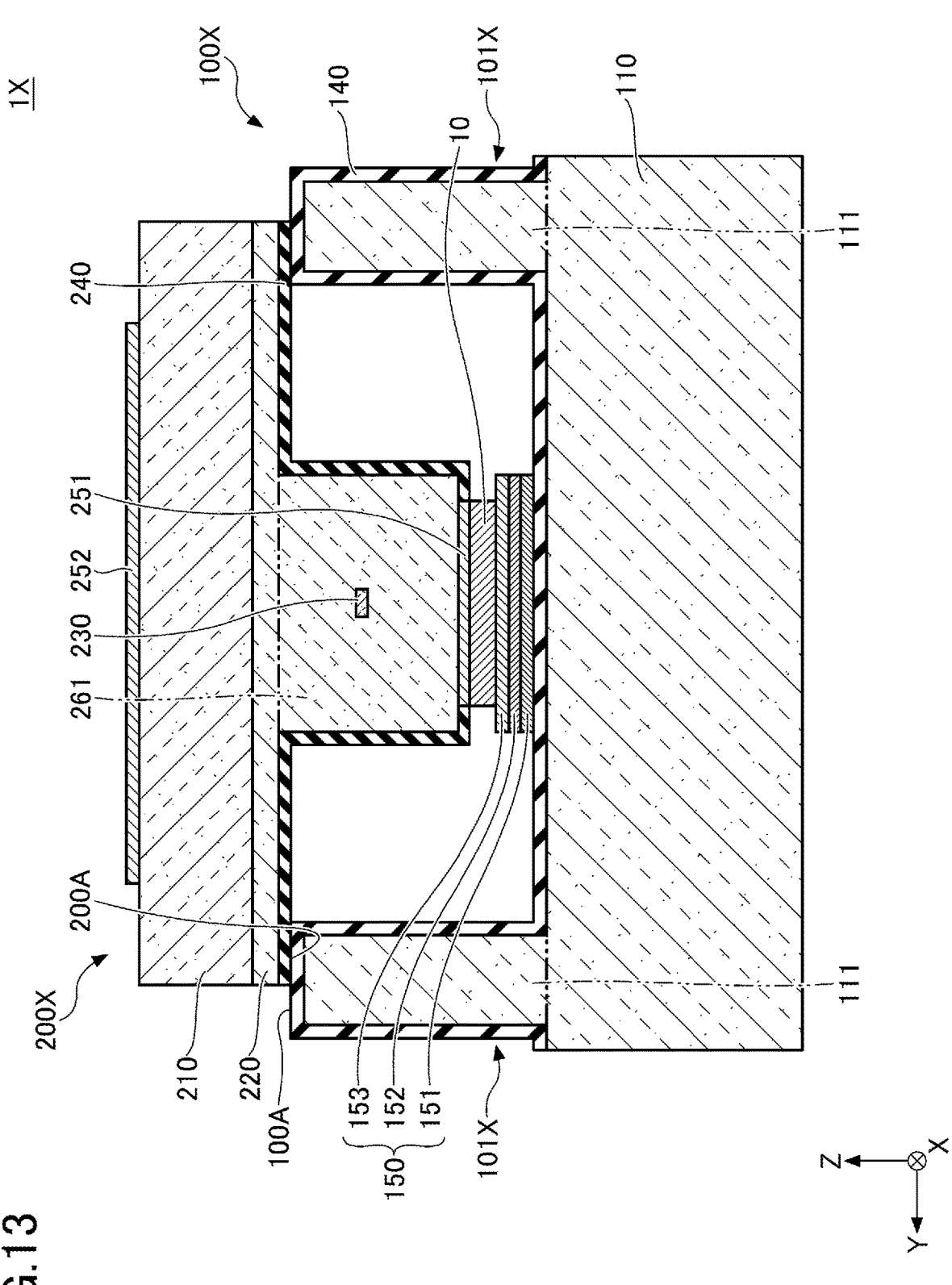
FIG. 13 is a cross sectional view illustrating an optical semiconductor device according to a reference example.

Further, because the first protrusion 101 is located on the inner side of the outer edge of the optical device 200 in the plan view, it is possible to reduce chipping of the optical device 200 caused by a contact between the silicon photonics device 100 and the optical device 200. Next, a reference example in which a portion of a first protrusion is located on an outer side of the outer edge of the LD will be described. FIG. 13 is a cross sectional view illustrating an optical semiconductor device according to the reference example.

An optical semiconductor device 1X according to the reference example includes a silicon photonics device 100X having a first surface 100A, and an optical device 200X having a second surface 200A.

The optical device 200X is not provided with the second protrusion 202. Otherwise, the configuration of the optical device 200X is similar to the configuration of the optical device 200. The silicon photonics device 100X includes a first protrusion 101X in place of the first protrusion 101. The first protrusion 101X is provided at a position overlapping an edge of the optical device 200X in the plan view, and has a height reaching the optical device 200X. Otherwise, the configuration of the silicon photonics device 100X is similar to the configuration of the silicon photonics device 100.

In the optical semiconductor device 1X, corner portions where a lower surface and a sidewall surface of the optical device 200X intersect are located above the first protrusion 101. For this reason, when a force is applied to the optical device 200X in a direction toward the silicon photonics device 100X during the flip-chip bonding of the optical device 200X, a stress tends to concentrate at the corner portions of the optical device 200X, and chipping tends to occur at the corner portions.

In contrast, in the optical semiconductor device 1, because the first protrusion 101 is located on the inner side of the outer edge of the optical device 200 in the plan view, it is possible to avoid the concentration of the stress that occurs in the reference example. Although an upward force acts on the second protrusion 202, this force acts in a relatively uniform manner, such that the concentration of the stress is less likely to occur. Accordingly, chipping is also unlikely to occur in the second protrusion 202.

As described above, according to the first embodiment, it is possible to reduce the chipping of the optical device 200. Hence, it is possible to prevent a crack from extending from the chipped portion to the active layer 230, and to prevent the alignment accuracy from deteriorating. As a result, it is possible to prevent the yield and the reliability of the optical device 200 from deteriorating due to the chipping.

As described above, when manufacturing the optical device 200, the semiconductor layer is regrown (refer to FIG. 8). During this regrowth, an abnormal growth of the semiconductor layer may easily occur near the corner portions where two side surfaces of the portion that becomes the protruding portion 262 intersect, particularly near the corner portions where the angle formed by the two side surfaces is 90°, and near the side surfaces having a small length along a direction parallel to the XY-plane. For example, the abnormal growth of the semiconductor layer is likely to occur near the end portion on the +X-side and near the end portion on the −X-side of the portion covered by the mask 282 in FIG. 7. This is because various crystal planes are present near the portion where crystal growth occurs. Further, at the portion where the abnormal growth occurs, the semiconductor layer 223 becomes thicker than at the portion where the normal crystal growth occurs. A difference between the thicknesses of the semiconductor layer 223 at the portion where the abnormal crystal growth occurs and the portion where the normal crystal growth occurs, may be approximately 2 μm, for example. Because the portion where the abnormal growth occurs includes a crystal plane that is difficult to removed by wet etching or the like, it may not be possible to completely remove this portion even at subsequent processes or steps, and this portion may remain with a thickness in a range of approximately 0.5 μm to approximately 1 μm, for example, even after the optical device is completed.

In the first embodiment, both end portions of the second protrusion 202 along the X-axis direction are located on the outer sides of both end portions of the first protrusion 101 along the X-axis direction. For this reason, even if the abnormal growth described above were to occur, the portion having the increased thickness due to the abnormal growth will not make contact with the first protrusion 101. Accordingly, it is possible to perform a high-precision alignment (that is, alignment with a high accuracy).

The end portion of the second protrusion 202 along the X-axis direction is located at a position on the outer side of the end portion of the first protrusion 101 along the X-axis direction by a distance greater than or equal to 80 μm along the first direction, more preferably by a distance greater than or equal to 100 μm along the X-axis direction, and still more preferably by a distance greater than or equal to 120 μm along the X-axis direction.

Second Embodiment

Figure 14:
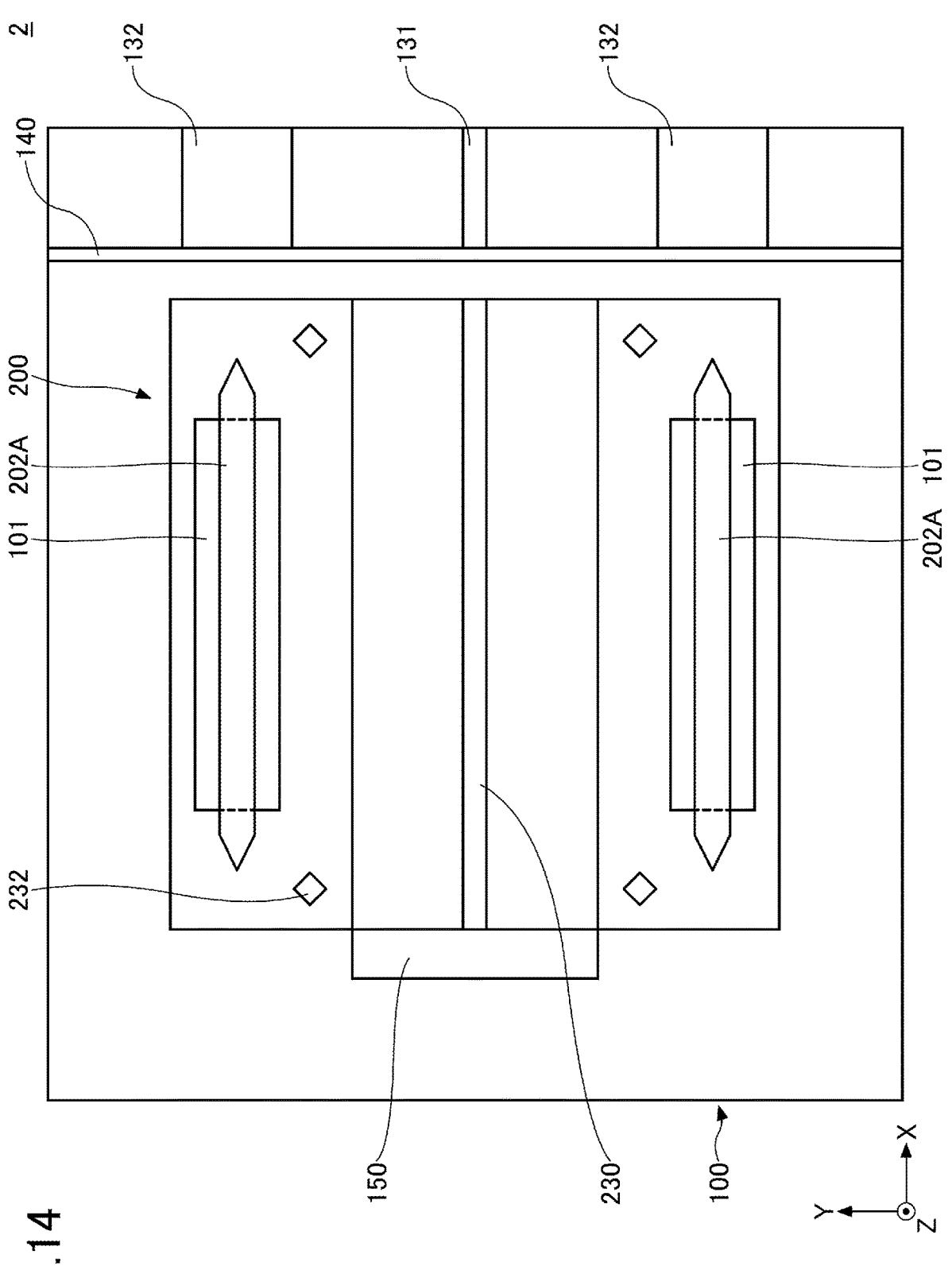
FIG. 14 is a schematic view illustrating an arrangement of respective parts of the optical semiconductor device according to a second embodiment.

A second embodiment will be described. The second embodiment differs from the first embodiment mainly in the shapes of the end portions of the second protrusion on both the +X-side and the −Y-side of the second protrusion. FIG. 14 is a schematic view illustrating an arrangement of respective parts of the optical semiconductor device according to the second embodiment.

As illustrated in FIG. 14, in an optical device 2 according to the second embodiment, the optical device 200 includes second protrusions 202A in place of the second protrusions 202. The end portion on the +X-side of the protruding portion of the cladding layer 220 included in the second protrusion 202A has two side surfaces that are inclined from both the YZ-plane and the ZX-plane in the plan view. These two side surfaces are crystal planes different from a (011) plane and a (0-1-1) plane. The end portion on the −X-side of the protruding portion of the cladding layer 220 included in the second protrusion 202A also has two side surfaces that are inclined from both the YZ-plane and the ZX-plane in the plan view. These two side surfaces are also crystal planes different from the (011) plane and the (0-1-1) plane. In a case where a negative crystallographic index is usually expressed by indicating a "- (bar)" above a number, but in the present specification, a minus sign is added in front of the number.

Otherwise, the configuration of the second embodiment is similar to the configuration of the first embodiment.

According to the second embodiment, it is possible to obtain effects similar to the effects obtainable by the first embodiment. In addition, the end portions on both the +X-side and the −Y-side of the protruding portion of the cladding layer 220 included in the second protrusion 202A have two side surfaces inclined from both the YZ-plane and the ZX-plane in the plan view. Accordingly, the angle formed by the two side surfaces at the corner portion is not 90°, and it is easier to reduce the abnormal growth compared to the case where the angle formed by the two side surfaces at the corner portion is 90°. In addition, in a case where the side surface is the (011) plane or the (0-1-1) plane, the abnormal growth is relatively likely to occur, but because the side surface in the second embodiment is a crystal plane different from the (011) plane and the (0-1-1) plane, the abnormal growth can easily be reduced also from this viewpoint. For this reason, according to the second embodiment, it is possible to more easily to manufacture the optical device 200 having a high dimensional accuracy.

In the present disclosure, in a case where the planar shape of the second protrusion is a polygonal shape, the angle of each vertex of the polygonal shape is preferably deviated from 90°.

Third Embodiment

Figure 15:
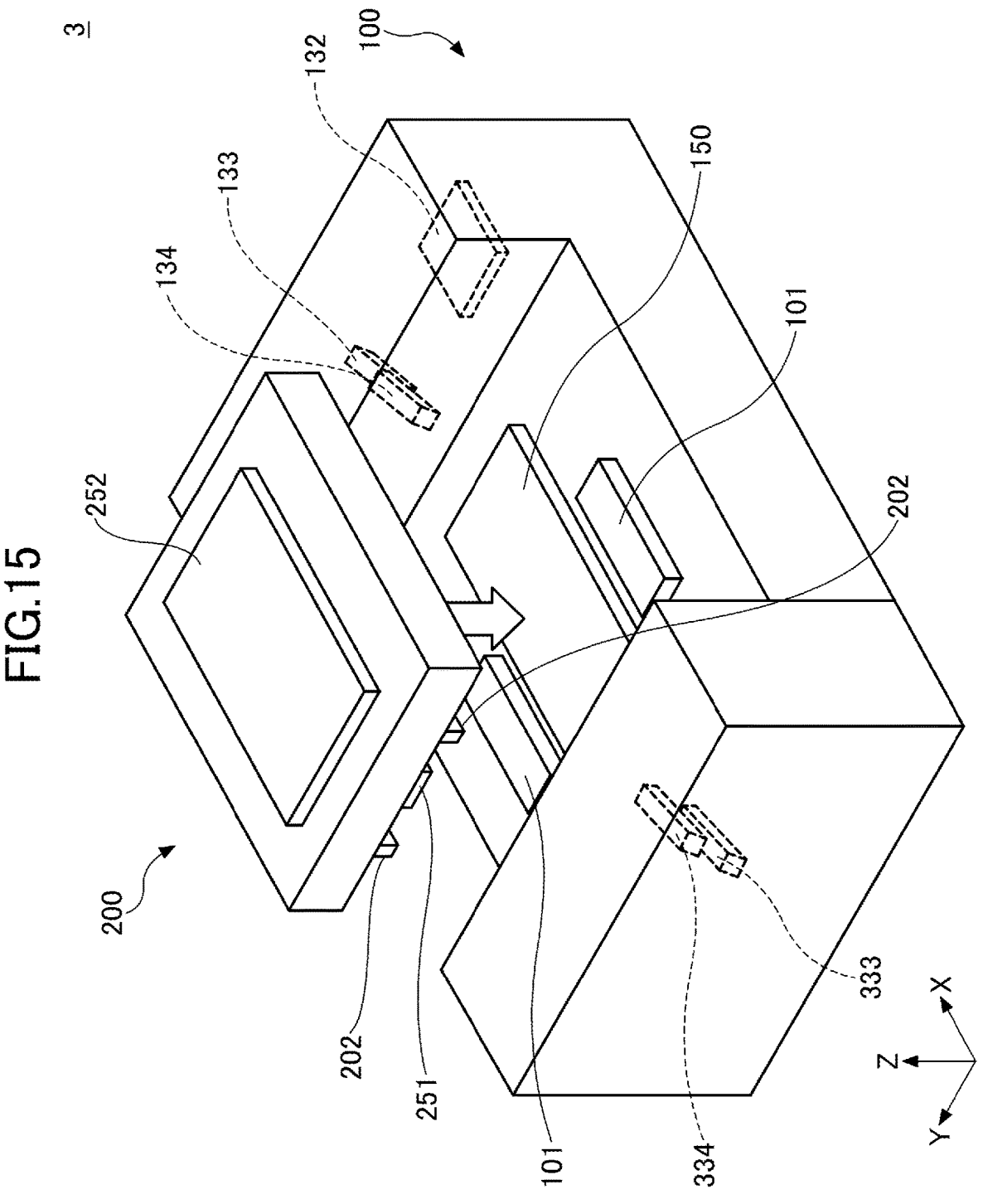
FIG. 15 is a disassembled perspective view illustrating the optical semiconductor device according to a third embodiment.
Figure 16:
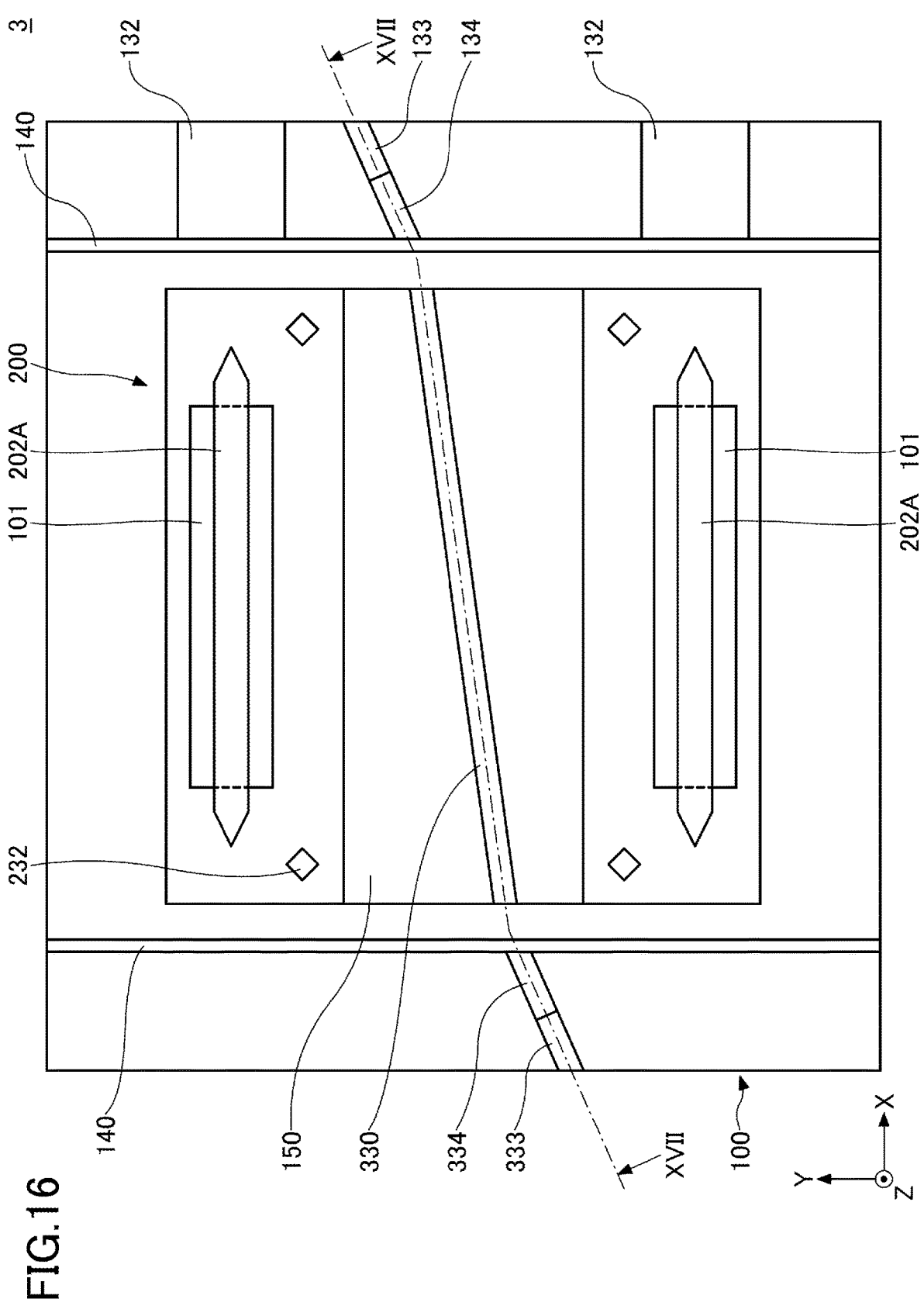
FIG. 16 is a schematic view illustrating an arrangement of respective parts of the optical semiconductor device according to the third embodiment.
Figure 17:
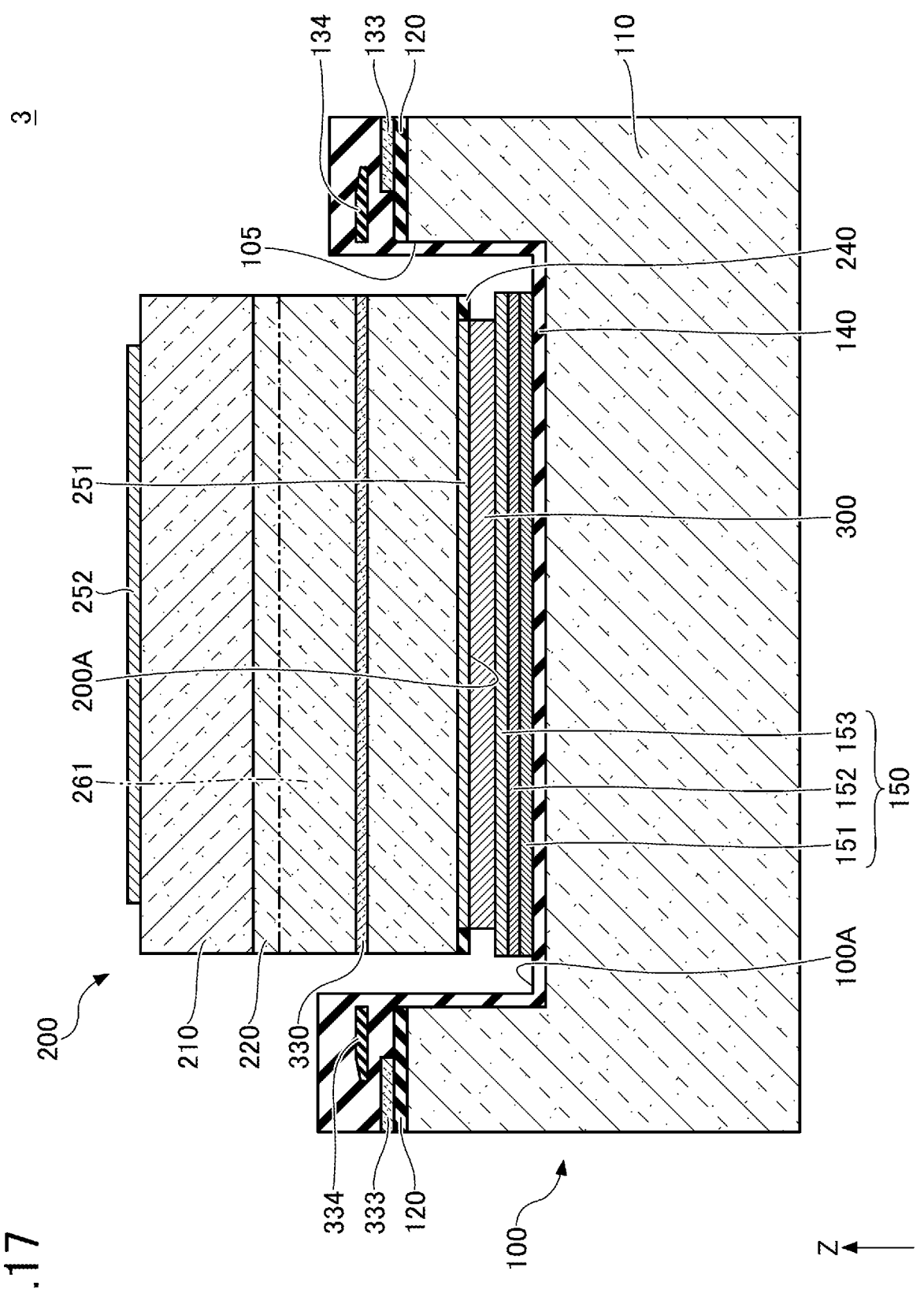
FIG. 17 is a cross sectional view illustrating the optical semiconductor device according to the third embodiment.

A third embodiment will be described. The third embodiment differs from the second embodiment mainly in the configuration of the optical device. FIG. 15 is a disassembled perspective view illustrating the optical semiconductor device according to the third embodiment. FIG. 16 is a schematic view illustrating an arrangement of respective parts of the optical semiconductor device according to the third embodiment. FIG. 17 is a cross sectional view illustrating the optical semiconductor device according to the first embodiment. FIG. 17 corresponds to a cross sectional view along a line XVII-XVII in FIG. 16.

In an optical semiconductor device 3 according to the third embodiment, the optical device 200 is a semiconductor optical amplifier (SOA). As illustrated in FIG. 15 through FIG. 17, the optical device 200 includes an active layer 330 in place of the active layer 230. The cladding layer 220 and the active layer 330 include a InP-based material. The configuration of the cladding layer 220 may be different from that of the second embodiment. The active layer 330 extends along a direction inclined from the X-axis direction.

The silicon photonics device 100 includes spot size converters (SSCs) 134 and 334. The SSC 134 is disposed near an end face on a light emission side (+X-side) of the active layer 330 of the optical device 200. The SSC 334 is disposed near an end face on a light incident side (−X-side) of the active layer 330 of the optical device 200. The SSCs 134 and 334 are formed of a silicon nitride layer, for example. Positions of the SSCs 134 and 334 along the Z-axis direction are the same as the position of the active layer 330 along the Z-axis direction. The silicon photonics device 100 includes waveguides 133 and 333. The waveguide 133 is provided in place of the waveguide 131. The waveguides 133 and 333 are included in the silicon layer of the SOI substrate. The waveguide 133 is provided below the side SSC 134. The waveguide 333 is provided below the SSC 334. The waveguide 133 is separated from the SSC 134 by a distance of approximately 300 nm along the Z-axis direction, and the waveguide 333 is separated from the SSC 334 by a distance of approximately 300 nm along the Z-axis direction. For example, the end portions of the SSCs 134 and 334 on the side farther away from the optical device 200 have tapered shapes for causing transition of light in the waveguides 133 and 333 at a low loss. The SSCs 134 and 334 extend along a direction more greatly inclined from the X-axis direction than the active layer 330. The waveguides 133 and 333 extend in the same direction as the SSCs 134 and 334, respectively.

Otherwise, the configuration of the third embodiment is similar to the configuration of the second embodiment.

According to the third embodiment, it is possible to obtain effects similar to the effects obtainable by the second embodiment. In other words, even in the case where the optical device 200 is the SOA, it is possible to obtain the effects such as reducing the chipping of the optical device 200 or the like, similar to the case where the optical device 200 is the LD.

Fourth Embodiment

Figure 18:
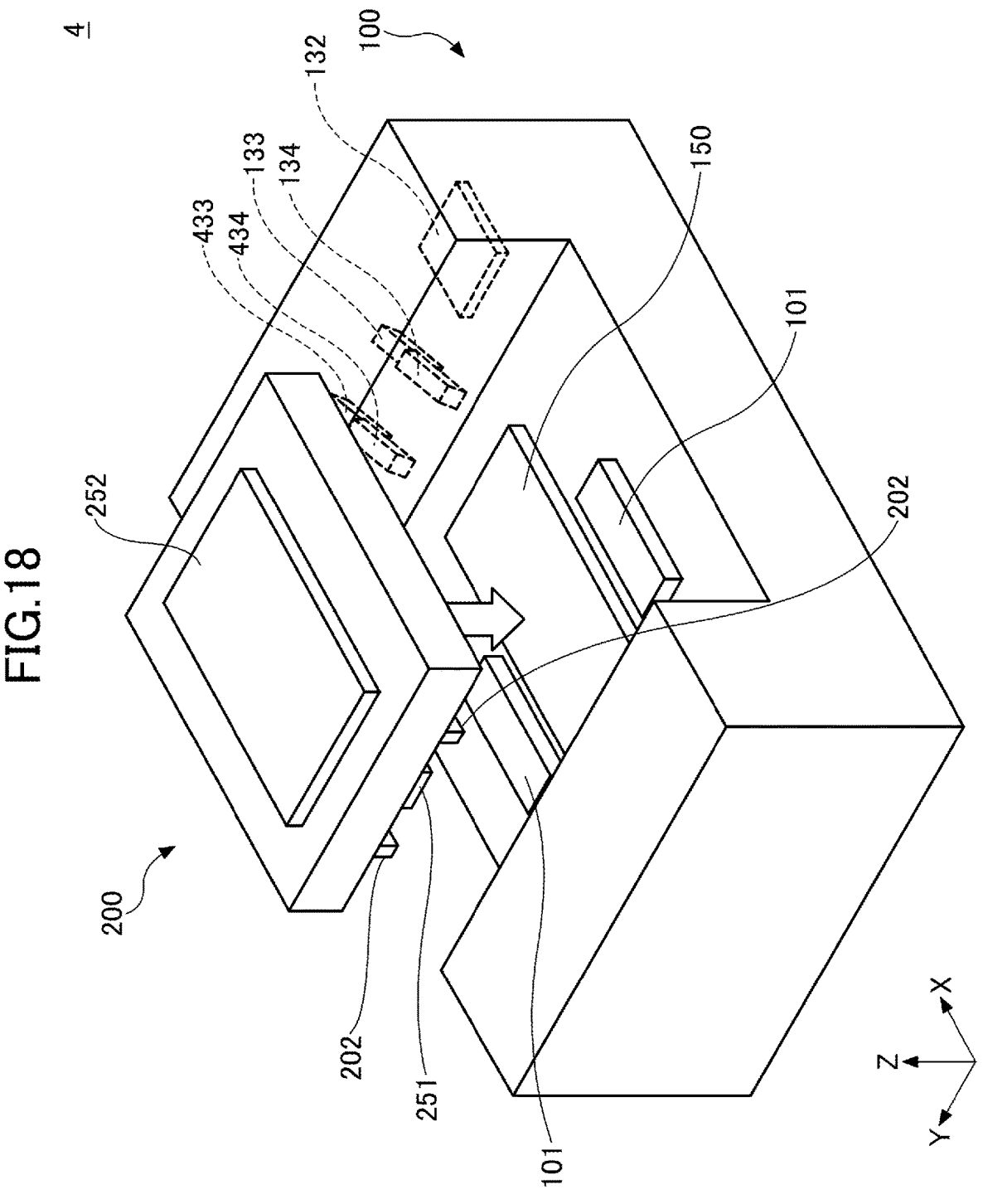
FIG. 18 is a disassembled perspective view illustrating the optical semiconductor device according to a fourth embodiment.
Figure 19:
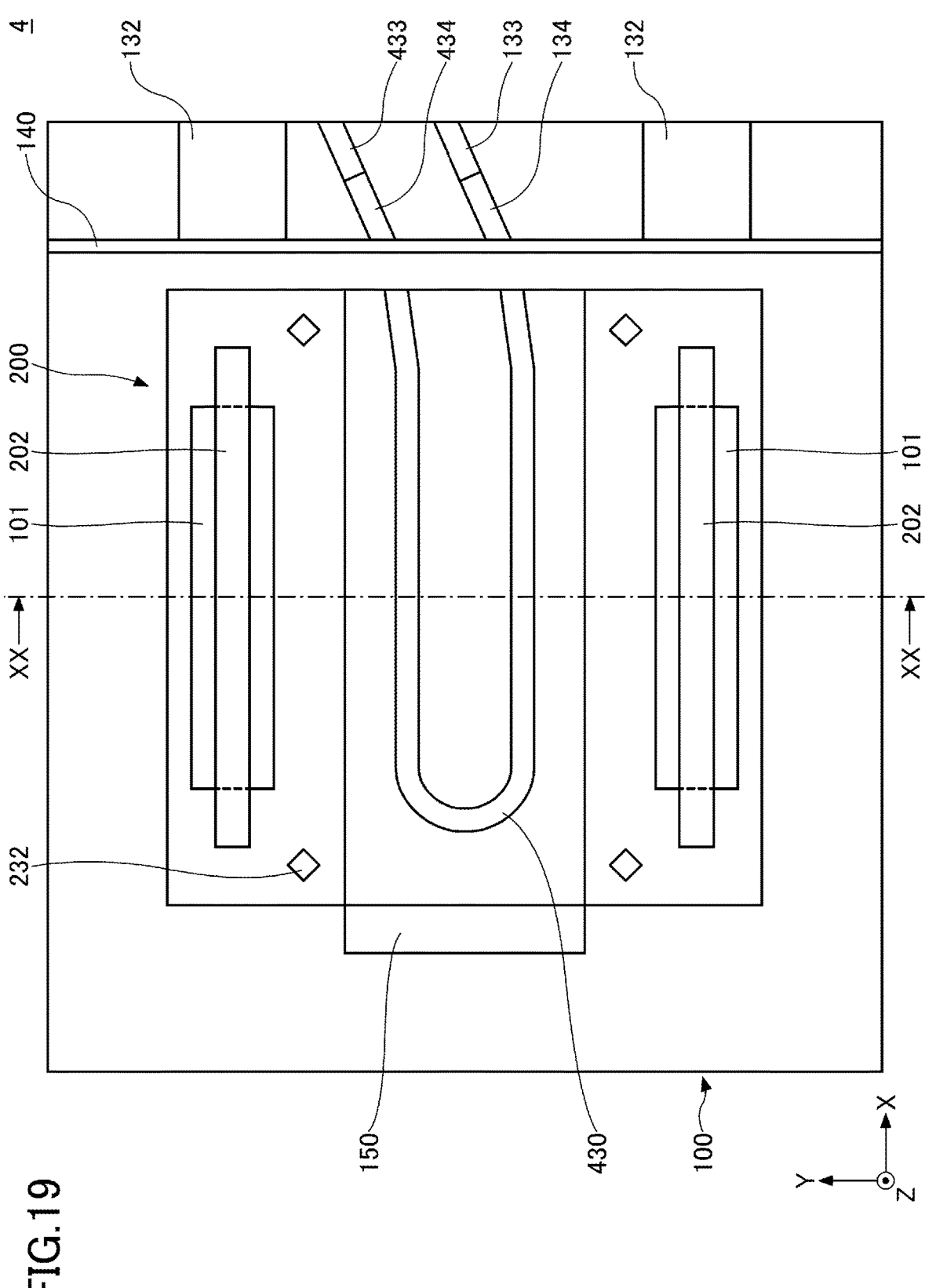
FIG. 19 is a schematic view illustrating an arrangement of respective parts of the optical semiconductor device according to the fourth embodiment.
Figure 20:
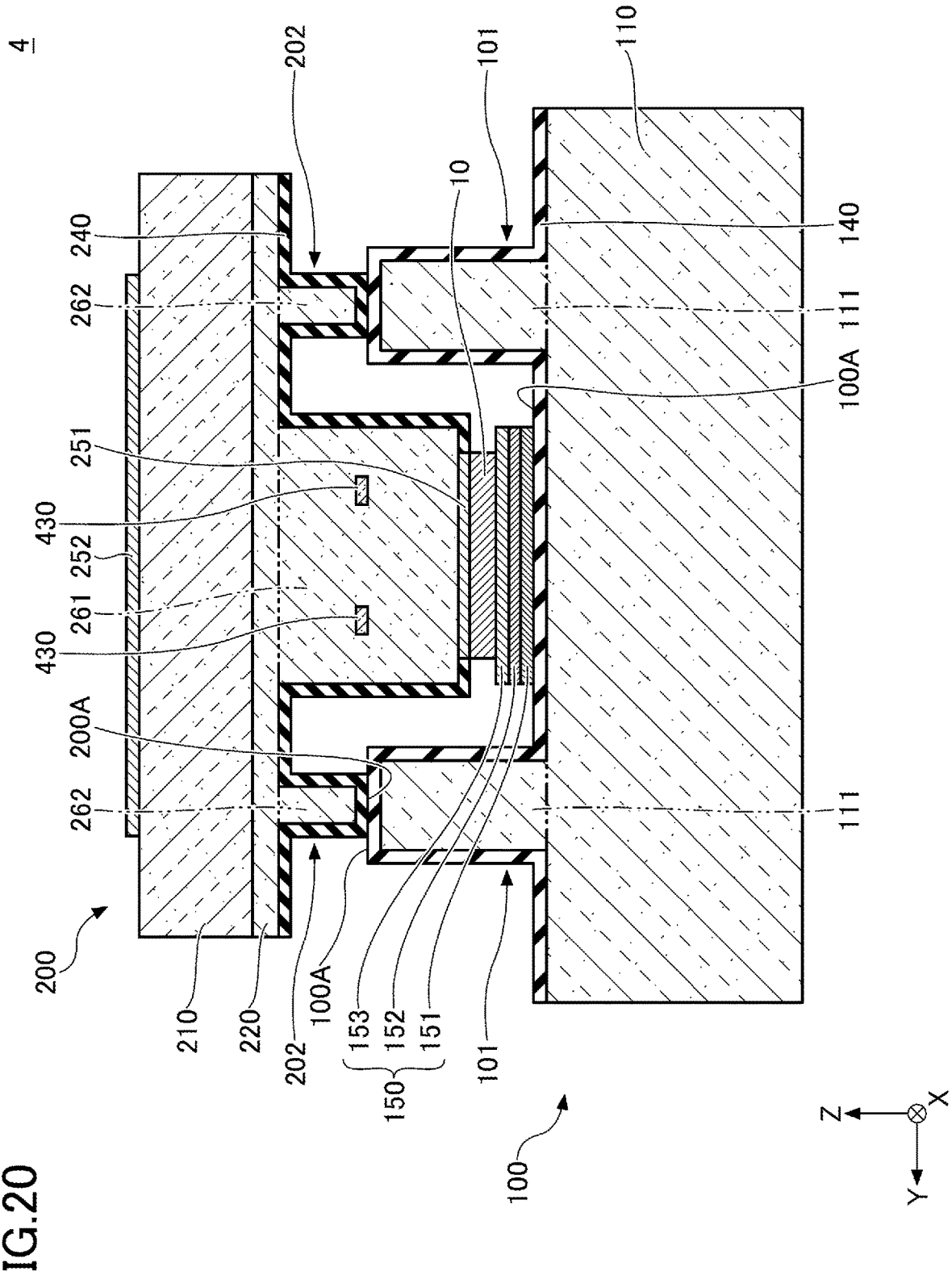
FIG. 20 is a cross sectional view illustrating the optical semiconductor device according to the fourth embodiment.

A fourth embodiment will be described. The fourth embodiment differs from the third embodiment in the configuration of the active layer of the SOA. FIG. 18 is a disassembled perspective view illustrating the optical semiconductor device according to the fourth embodiment. FIG. 19 is a schematic view illustrating an arrangement of respective parts of the optical semiconductor device according to the fourth embodiment. FIG. 20 is a cross sectional view illustrating the optical semiconductor device according to the fourth embodiment. FIG. 20 corresponds to a cross sectional view along a line XX-XX in FIG. 19.

As illustrated in FIG. 18 through FIG. 20, in an optical semiconductor device 4 according to the fourth embodiment, the optical device 200 includes an active layer 430 in place of the active layer 330. A planar shape of the active layer 430 is U-shaped. In the plan view, the active layer 430 includes two linear portions extending in the X-axis direction, and a semicircular portion connecting end portions on the −X-side of the two linear portions, for example. A distance between the two linear portions is approximately 250 μm, for example. The optical device 200 is a so-called U-turn type SOA (U-SOA). Both the incidence of light to the active layer 430 and the emission of light from the active layer 430 are performed at the end face on the +X-side of the optical device 200.

The silicon photonics device 100 includes a SSC 434 and a waveguide 433 in place of the SSC 334 and the waveguide 333. The SSC 434 is disposed near the end face on the incident side (+X-side) of the active layer 330 of the optical device 200. The SSC 434 is formed of a silicon nitride layer, for example. The positions of the SSC 134 and 434 along the Z-axis direction are the same as the position of the active layer 430 along the Z-axis direction. The waveguide 433 is included in the silicon layer of the SOI substrate. The waveguide 433 is provided below the SSC 434. The waveguide 433 and the SSC 434 are separated by a distance of approximately 300 nm along the Z-axis direction. For example, the end portion of the SSC 434 on the side farther away from the optical device 200 has a tapered shape for causing transition of light in the waveguide 433 at a low loss. The SSC 434 extends along a direction more greatly inclined from the X-axis direction than the active layer 330. The waveguide 433 extends in the same direction as the SSC 434.

Otherwise, the configuration of the fourth embodiment is similar to the configuration of the third embodiment.

According to the fourth embodiment, it is possible to obtain effects similar to the effects obtainable by the third embodiment. In addition, because both the SSCs 334 and 434 are located on the +X-side of the optical device 200, it is possible to further reduce the coupling deviation caused by a minute rotation or inclination of the optical device 200, when compared to the third embodiment. Accordingly, it is possible to more stably reduce a coupling loss.

The compound semiconductor included in the second optical device is not limited to the InP-based semiconductor, and a GaAs-based semiconductor may be included in the second optical device. For example, the second optical device may include a GaAs substrate, and a semiconductor layer including a GaAs-based semiconductor.

According to the present disclosure, it is possible to reduce chipping of the optical device.

Although the embodiments are numbered with, for example, "first," "second," "third," or "fourth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical semiconductor device comprising:
a first optical device formed on a silicon substrate having a first surface; and
a second optical device including a compound semiconductor, mounted on the first optical device, and having a second surface facing the first surface, wherein:
the first optical device includes a first protrusion that protrudes toward the second surface,
the second optical device includes a second protrusion that protrudes toward the first surface and makes contact with the first protrusion,
a portion of the second surface makes contact with the first protrusion,
in a plan view, the first and second protrusions have a planar shape having a first direction as a longitudinal direction of the first and second protrusions and a second direction perpendicular to the first direction as a short direction of the first and second protrusions, and the first protrusion is located on an inner side of an outer edge of the second optical device,
in a cross section perpendicular to the first direction, a width of the first protrusion along the second direction is greater than a width of the second protrusion along the second direction, and
in the plan view, outer edges of the first protrusion on two opposite ends of the first protrusion along the first direction are not aligned to outer edges of the second protrusion on two opposite ends of the second protrusion along the first direction.

2. The optical semiconductor device as claimed in claim 1, wherein
in the plan view, the second optical device has a planar shape having the first direction as a longitudinal direction thereof.

3. The optical semiconductor device as claimed in claim 2, wherein the second optical device includes an active layer extending in the first direction.

4. The optical semiconductor device as claimed in claim 2, wherein the two opposite ends of the second protrusion along the first direction are located on outer sides of the two opposite ends of the first protrusion along the first direction, respectively.

5. The optical semiconductor device as claimed in claim 4, wherein
in the plan view, the second protrusion has a polygonal planar shape, and
an angle of each vertex of the polygonal shape is deviated from 90°.

6. The optical semiconductor device as claimed in claim 4, wherein the the two opposite ends of the second protrusion along the first direction are located at positions on the outer sides of the two opposite ends of the first protrusion along the first direction by a distance greater than or equal to 80 um along the first direction, respectively.

7. The optical semiconductor device as claimed in claim 1, wherein the second optical device is flip-chip bonded to the first optical device.

8. The optical semiconductor device as claimed in claim 1, wherein the second optical device is a semiconductor laser.

9. The optical semiconductor device as claimed in claim 1, wherein the second optical device is a semiconductor optical amplifier.

10. The optical semiconductor device as claimed in claim 1, wherein the second optical device includes one of a InP-based material or a GaAs-based material.

11. The optical semiconductor device as claimed in claim 1, wherein:
the first optical device includes a pair of first protrusions, and
the second optical device includes a pair of second protrusions.

12. The optical semiconductor device as claimed in claim 11, wherein the first optical device further includes:
a first insulating layer provided on the silicon substrate and covering the pair of first protrusions, and
a first electrode provided on the first insulating layer at a position located between the pair of first protrusions and having the first direction as a longitudinal direction of the first electrode.

13. The optical semiconductor device as claimed in claim 12, wherein the second optical device further includes:
a second insulating layer covering the second surface and the pair of second protrusions, and
a second electrode provided on a surface opposite to the second surface and having the first direction as a longitudinal direction of the second electrode,
wherein a width of the second electrode along the second direction is greater than a width of the first electrode along the second direction.

14. The optical semiconductor device as claimed in claim 1, wherein:
the second optical device further includes a cladding layer,
the second protrusion protrudes from the cladding layer toward the first surface,
the cladding layer includes a mesa structure protruding from the cladding layer more toward the first surface than the second protrusion, and
the mesa structure has the first direction as a longitudinal direction of the mesa structure, and makes no contact with the first and second protrusions.

* * * * *